United States Patent
Kuovo et al.

(10) Patent No.: US 11,885,853 B2
(45) Date of Patent: Jan. 30, 2024

(54) ONLINE BATTERY STATE OF HEALTH ESTIMATION DURING CHARGING

(71) Applicant: SANDVIK MINING AND CONSTRUCTION OY, Tampere (FI)

(72) Inventors: Mikko Kuovo, Vallinby (SE); Harri Vatanen, Tampere (FI); Raimo Juntunen, Tampere (FI)

(73) Assignee: Sandvik Mining and Construction Oy, Tampere (FI)

( * ) Notice: Subject to any disclaimer, the term of this patent is extended or adjusted under 35 U.S.C. 154(b) by 143 days.

(21) Appl. No.: 17/425,879

(22) PCT Filed: Jan. 28, 2020

(86) PCT No.: PCT/EP2020/051994
§ 371 (c)(1),
(2) Date: Jul. 26, 2021

(87) PCT Pub. No.: WO2020/157038
PCT Pub. Date: Aug. 6, 2020

(65) Prior Publication Data
US 2022/0163594 A1    May 26, 2022

(30) Foreign Application Priority Data
Jan. 28, 2019 (EP) .................................. 19153935

(51) Int. Cl.
*G01R 31/392* (2019.01)
*B60L 53/62* (2019.01)
(Continued)

(52) U.S. Cl.
CPC ............ *G01R 31/392* (2019.01); *B60L 53/62* (2019.02); *B60L 53/65* (2019.02); *B60L 58/16* (2019.02);
(Continued)

(58) Field of Classification Search
None
See application file for complete search history.

(56) References Cited

U.S. PATENT DOCUMENTS

2012/0105068 A1* 5/2012 Wang ................ H01M 10/0525
324/427
2014/0145684 A1* 5/2014 Liu ......................... B60L 58/15
320/152

(Continued)

FOREIGN PATENT DOCUMENTS

CN    204030688 U    12/2014
EP      2068161 A2     6/2009

*Primary Examiner* — Jas A Sanghera
(74) *Attorney, Agent, or Firm* — Corinne R. Gorski

(57) ABSTRACT

A method for determining the state of health of a battery by monitoring charging of the battery over multiple charging instances is provided. The method is implemented within charging stations by: recognizing the battery via a unique identifier; charging the battery; monitoring conditions of the battery during charging; storing data related to the current charging instance based at least partially on the monitored conditions; retrieving data related to at least one earlier charging instance of the uniquely identified battery; and making a determination of the uniquely identified battery's state of health based at least partially on a comparison of the data related to the current charging instance and the retrieved data related to at least one earlier charging instance.

16 Claims, 6 Drawing Sheets

(51) Int. Cl.
*B60L 58/16* (2019.01)
*B60L 53/65* (2019.01)
*H02J 7/00* (2006.01)
*H01M 10/44* (2006.01)
*H01M 10/48* (2006.01)

(52) U.S. Cl.
CPC ........... *H01M 10/44* (2013.01); *H01M 10/48* (2013.01); *H02J 7/005* (2020.01); *B60L 2200/40* (2013.01); *B60L 2240/545* (2013.01); *B60L 2240/547* (2013.01)

(56) References Cited

U.S. PATENT DOCUMENTS

| | | | |
|---|---|---|---|
| 2014/0266227 A1* | 9/2014 | Harman | G07C 5/085 |
| | | | 324/426 |
| 2018/0043785 A1* | 2/2018 | Takatsuka | H02J 7/005 |
| 2018/0118049 A1 | 5/2018 | Ko | |
| 2018/0372806 A1* | 12/2018 | Laughery | H02J 7/00 |

* cited by examiner

ONLINE BATTERY STATE OF HEALTH ESTIMATION DURING CHARGING

RELATED APPLICATION DATA

This application is a § 371 National Stage Application of PCT International Application No. PCT/EP2020/051994 filed Jan. 28, 2020 claiming priority to EP 19153935.2 filed Jan. 28, 2019.

BACKGROUND

As batteries degrade over time and use their capacity decreases and their internal resistance increases. Degradation of batteries is accelerated by extreme temperatures, excessive charging or discharging or cycling the batteries through too wide a state of charge range. Not only does degradation of batteries lessen their usefulness, but it can also lead to increases in safety risks, especially when employed in vehicles.

Battery systems employed in vehicles and larger systems are expensive and difficult to replace or maintain. Battery State of Health (SOH) measurement and estimation allows for more precise monitoring of such battery systems and thus increased understanding of battery performance and longevity. Such information can be used to plan preventative maintenance and ensure that batteries are used for their full useful life. SOH information can also be contractually useful in instances when battery packs are leased.

Previously battery SOH measurements have involved lengthy and energy intensive processes. These processes may include a constant discharge of the battery over time which wastes energy and requires the battery to be out of service for an extended period, sometimes over eight hours.

Alternatively, SOH measurements use electrochemical techniques which involve directed measurement of electrolytes and electrodes of the battery. Such techniques involve a much more involved investigation of the battery and often require at least partial disassembly of the vehicle or device employing the battery if not of the battery itself.

Still other methods of SOH measurement require complicated and expensive equipment such as spectrometers or non-optical microscopes. Such equipment would be hard to employ in many environments and once again require special techniques to use.

In avoiding such complicated and expensive techniques some methods of battery SOH measurement have been developed which seek to apply mathematical models to estimate a battery's SOH. However, these models often require analysis of a large number of batteries of a similar construction in order to develop and must make assumptions regarding the type of battery cycles. In other words, they are rough estimations which assume that all batteries of a certain type are the same and they are all experiencing the same type of cycling. Assumptions which remain untrue in many operating environments, especially those of large machines in underground operation.

CN204030688U details an on-vehicle battery management system which monitors conditions of individual battery cells within a vehicle. The system has a wireless communication interface and a memory to provide for backup in instances when the wireless communication interface is inoperative.

EP2068161 details a method for determining state of health of a battery by comparing the difference in internal resistance of a battery during and after charging. The method seeks to avoid complicated tracking of battery system usage. Within the method described for determining battery state of health by measuring internal resistance, or internal conductance, it is mentioned that the battery may not be charging or under load.

SUMMARY OF THE INVENTION

The present invention provides for methods and systems for determining parameters of a battery under charge. These methods and systems consider each battery or battery pack individually and do not require that the battery be taken offline for testing or that expensive equipment be used in making such determinations.

The present invention provides for the ability to determine battery SOH during normal charging without the need to subject the battery to a special SOH estimation routine.

According to a first aspect of the present invention, there is provided a method for determining the state of health of a battery by monitoring charging of said battery over multiple charging instances, comprising a charging station implementing steps of: recognizing the battery via a unique identifier; charging the battery; monitoring conditions of the battery during charging, said conditions including at least one of: a voltage supplied to the battery, a current supplied to the battery and a temperature of the battery; storing data related to the current charging instance based at least partially on the monitored conditions; retrieving data related to at least one earlier charging instance of the uniquely identified battery; and making a determination of the uniquely identified battery's state of health based at least partially on a comparison of the data related to the current charging instance and the retrieved data related to at least one earlier charging instance.

According to a second aspect of the present invention, there is provided a battery charger for determining the state of health of a battery by monitoring charging of a battery over multiple charging instances, comprising power electronics configured to control delivery of electric energy to the battery, one or more meters configured to monitor conditions of the battery while charging, and control circuitry connected to the power electronics and the meters to cause: recognizing the battery via a unique identifier; charging the battery; monitoring conditions of the battery during charging, said conditions including at least one of: a voltage supplied to the battery, a current supplied to the battery and a temperature of the battery; storing data related to the current charging instance based at least partially on the monitored conditions; retrieving data related to at least one earlier charging instance of the uniquely identified battery; and making a determination of the uniquely identified battery's state of health based at least partially on a comparison of the data related to the current charging instance and the retrieved data related to at least one earlier charging instance.

According to a third aspect of the present invention, there is provided a battery charger comprising at least one processing core, at least one memory including computer program code, the at least one memory and the computer program code being configured to, with the at least one processing core, cause the battery charger at least to perform the method according to the first aspect of the present invention.

EMBODIMENTS

Definitions

The term battery as used herein includes but is not limited to: a battery, a battery cell and battery packs.

Figure 1:
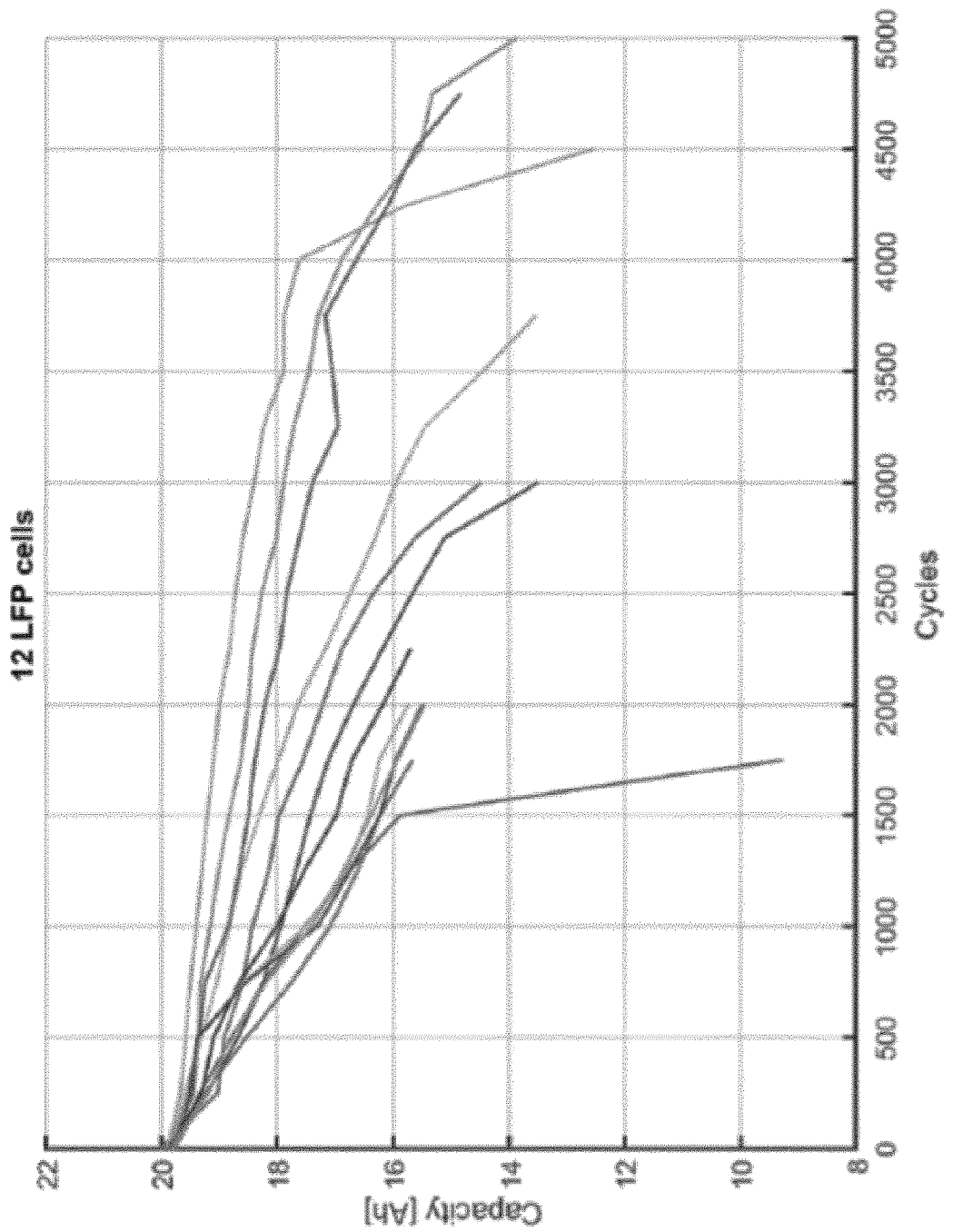
FIG. 1 shows the degradation of individual LFP battery cells over a number of cycles.

As seen in FIG. 1, battery or cell capacity degrades at a different rate in individual batteries. As such it is not always possible to accurate estimate a battery's state of health based on algorithms which assume that all batteries of a certain type degrade uniformly.

Many embodiments of the present invention not only allows for a determination of an individual battery's state of health, but also makes this determination during charging such that the battery is not taken out of service solely to determine its state of health. This is accomplished within at least some embodiments of the present invention by gathering data across multiple charging instances. Such data gathering can be preferable to data gathered during discharging as charging is more consistent. When a change in behavior across charging instances is noted a change in the battery's state of health can be determined.

Battery state of health (SOH) is an indicator which describes the present condition of a battery. It is most often described as a percentage compared to a fresh battery where a fresh battery would have a SOH of 100%. SOH can be determined based on many factors, for example, SOH can be based on the overall energy capacity of a battery. In such instances a SOH of 100% would indicate that the battery could still maintain its rated capacity. Such a SOH accounts for capacity degradation of batteries over time. Another example of a factor which can determine SOH would be battery power capability which would account for the battery's impedance increase over time.

Battery SOH determinations can be used to make a determination if the battery has reached an End of Life (EOL) condition. That is, the battery is no longer fit for use in an intended application. EOL conditions may vary based on the application and type of battery employed. For example, generally batteries having an 80% SOH may be considered to have reached their EOL when employed in industrial applications.

Embodiments of the present invention may employ a wide variety of methods to determine battery SOH. For example, methods may be employed which take direct measurements of the batteries during charging or use. Certain methods utilize models developed based on the battery model or a sampling of batteries under use. Some methods employ machine learning. Still other methods use incremental capacity analysis, differential voltage analysis, differential thermal voltammetry or fuzzy logic.

Certain embodiments of the present invention provide a method for determining the state of health of a battery by monitoring charging of the battery over multiple charging instances. Such methods may be implemented by charging stations, for example charging stations employed for mining vehicles in underground conditions. In at least some embodiments the method comprises the steps of: recognizing the battery via a unique identifier; charging the battery; monitoring at least one of: a voltage supplied to the battery, a current supplied to the battery and a temperature of the battery while charging the battery; storing data based at least partially on the values monitored during charging; retrieving data related to at least one earlier charging instance of the uniquely identified battery; and making a determination of the uniquely identified battery's state of health based at least partially on a comparison of data related to the current charging instance and the retrieved data.

Within certain embodiments of the present invention the battery is recognized using a unique identifier using a conductive connection to the battery. For example a communications connection port of the charging station may be connected to a communications port of the battery or a vehicle in which the battery is installed. Some embodiments identify the battery by identifying the equipment in which the battery is installed, for example the charging station may recognize a machine or vehicle which is connected to the charging station and thus identify the battery. Identification of the battery may be performed using a variety of techniques, for example, a visual identification may be made, a radio frequency identification (RFID) tag may be read from a battery or vehicle or a wireless communication link may be used to communicate between the charging station and battery or vehicle.

Using historical charging data a charging station employing embodiments of the present invention may use a variety of methods to make a determination of the battery's state of health. In at least some embodiments, the only data used in the determination of the battery's state of health is data gathered during charging of the battery. It at least some embodiments this includes data gathered during an ongoing charging instance and historical charging instances.

At least some embodiments of the present invention employ an enhanced coulomb counting method of determining SOH for a battery. Within such methods the charging unit integrates a current provided to the battery in order to determine an amount of charge provided. This information can then be combined with state of charge information in order to determine how much energy was required to bring the battery from one state of charge to another. Comparing this information to historical information can then be used to determine the battery's state of health. In some embodiments the method of determining the battery's state of health looks through historical data to try and compare instances when the battery was charged the most, for instance when the battery was charged from a fully depleted or near fully depleted state to a fully charged state.

Certain embodiments of the present invention make a determination of battery state of health using only data which was measured during a constant-current phase of charging. Such a limitation can help to eliminate variations in measurements and allows for comparison of a similar condition across historical use of the battery.

At least some embodiments of the present invention utilize a recursive algorithm to estimate the SOH of the battery. Certain embodiments employ an equivalent circuit model in addition to a recursive algorithm in order to determine battery SOH. These embodiments are adaptive to a wide array of input values and can be used when measurements may be noisy or contain inaccuracies.

Within some embodiments of the present invention a neural network is employed in order to determine parameters of the battery including SOH. Such embodiments may use data collected across multiple batteries in order to develop a model which can then be applied to determine individual battery SOH. Individual battery SOH determinations would then use the model developed along with data collected across multiple charging instances to determine the unique battery's SOH.

At least some embodiments of the present invention make a determination of the battery's SOH based at least partially on a change in monitored values between at least two monitored charging sessions. For example, certain embodiments of the present invention implement an incremental capacity analysis of the battery in order to determine battery SOH.

Figure 2A:
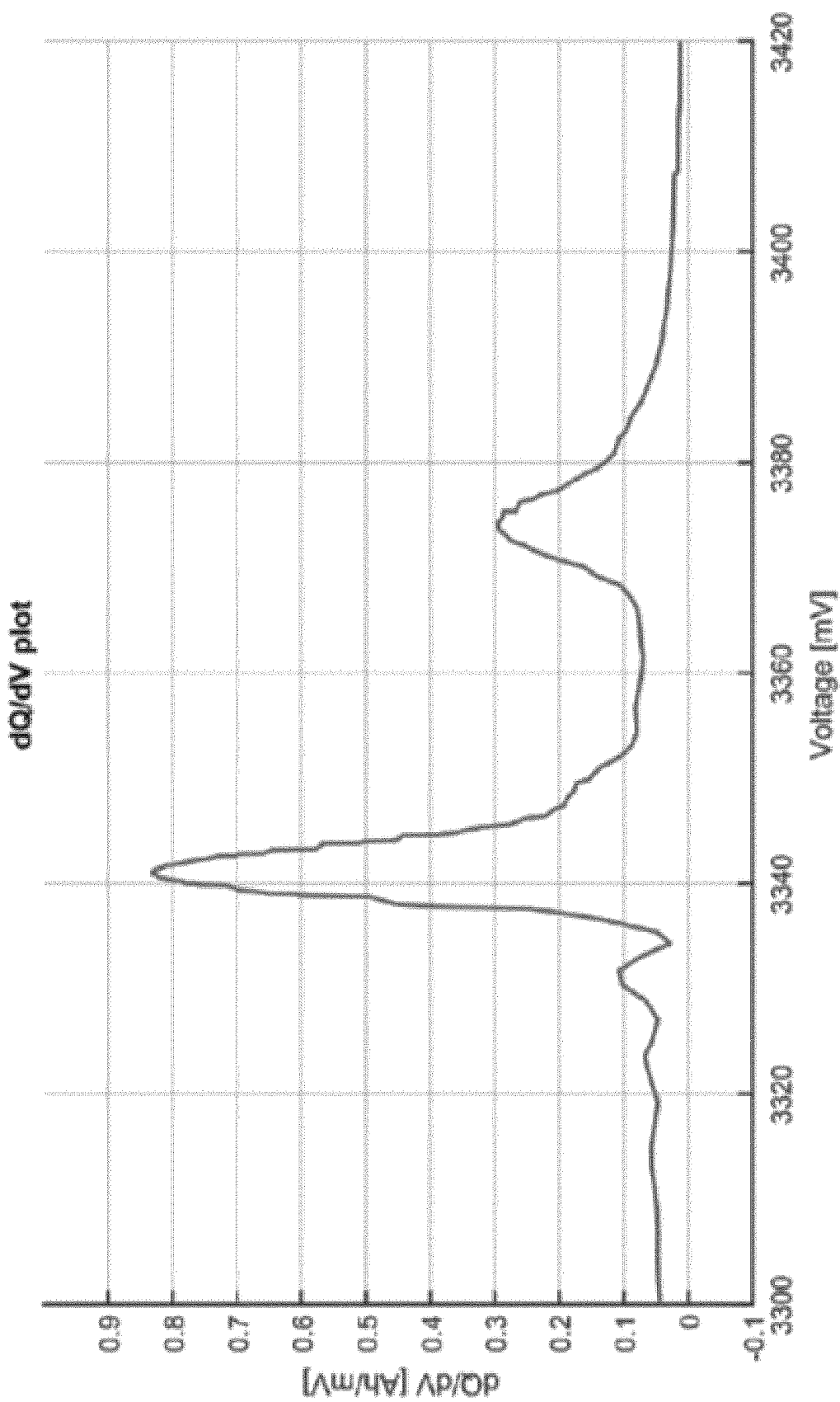
FIGS. 2A-2C illustrate the derivation of an incremental capacity curve according to at least some embodiments of the present invention.

Within embodiments employing Incremental Capacity Analysis (ICA) the battery's charged capacity is differentiated with respect to the battery's terminal voltage in order to obtain an incremental capacity curve (dQ/dV). An example incremental capacity curve is provided in FIG. 2A. As can be seen in FIG. 2, changes in the incremental capacity curve reflect changes in the behaviour and electrochemical properties of the battery. These changes can be monitored over a variety of charging instances to arrive at a SOH for the battery.

Figure 2B:
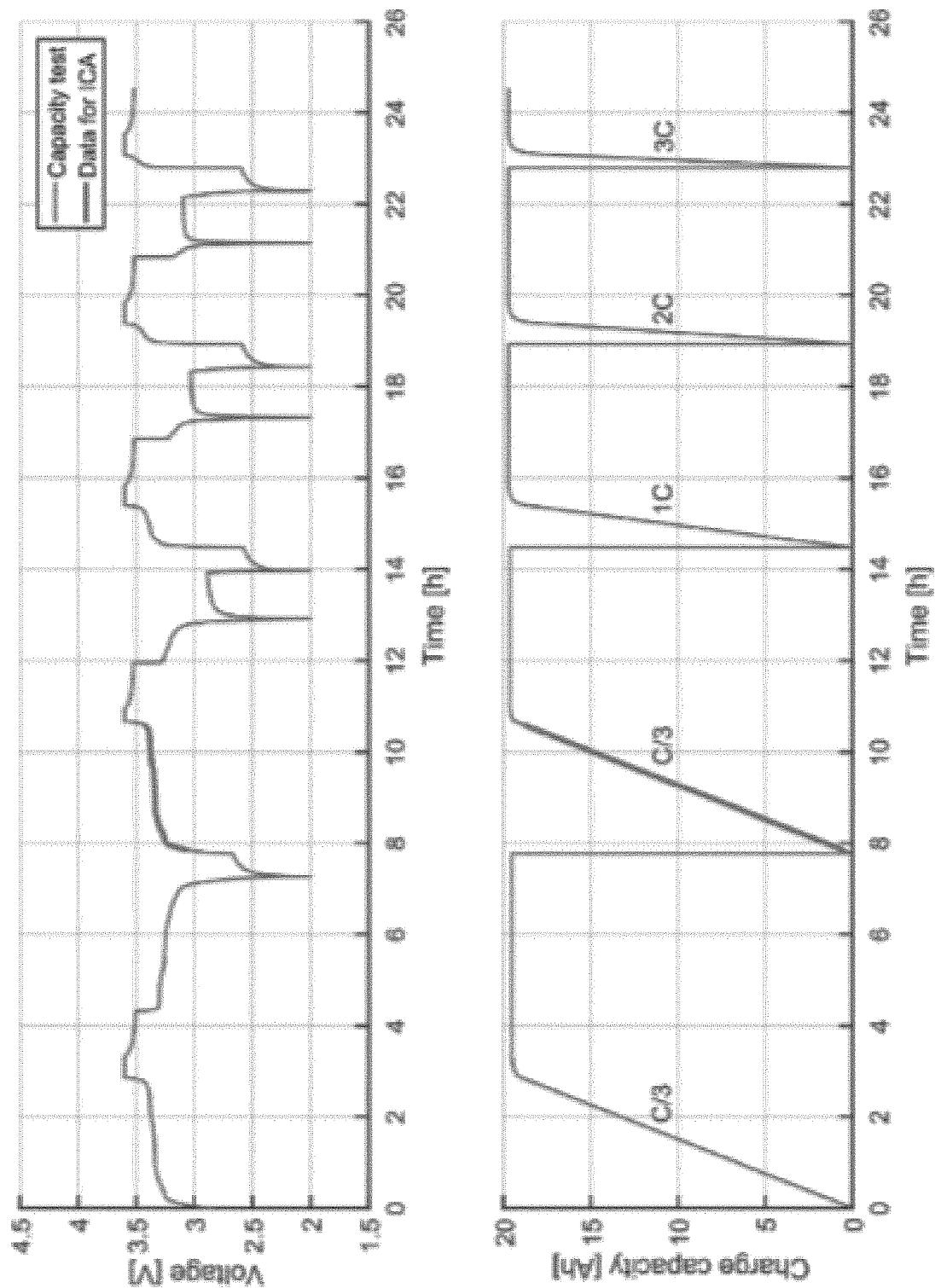
Figure 2C:
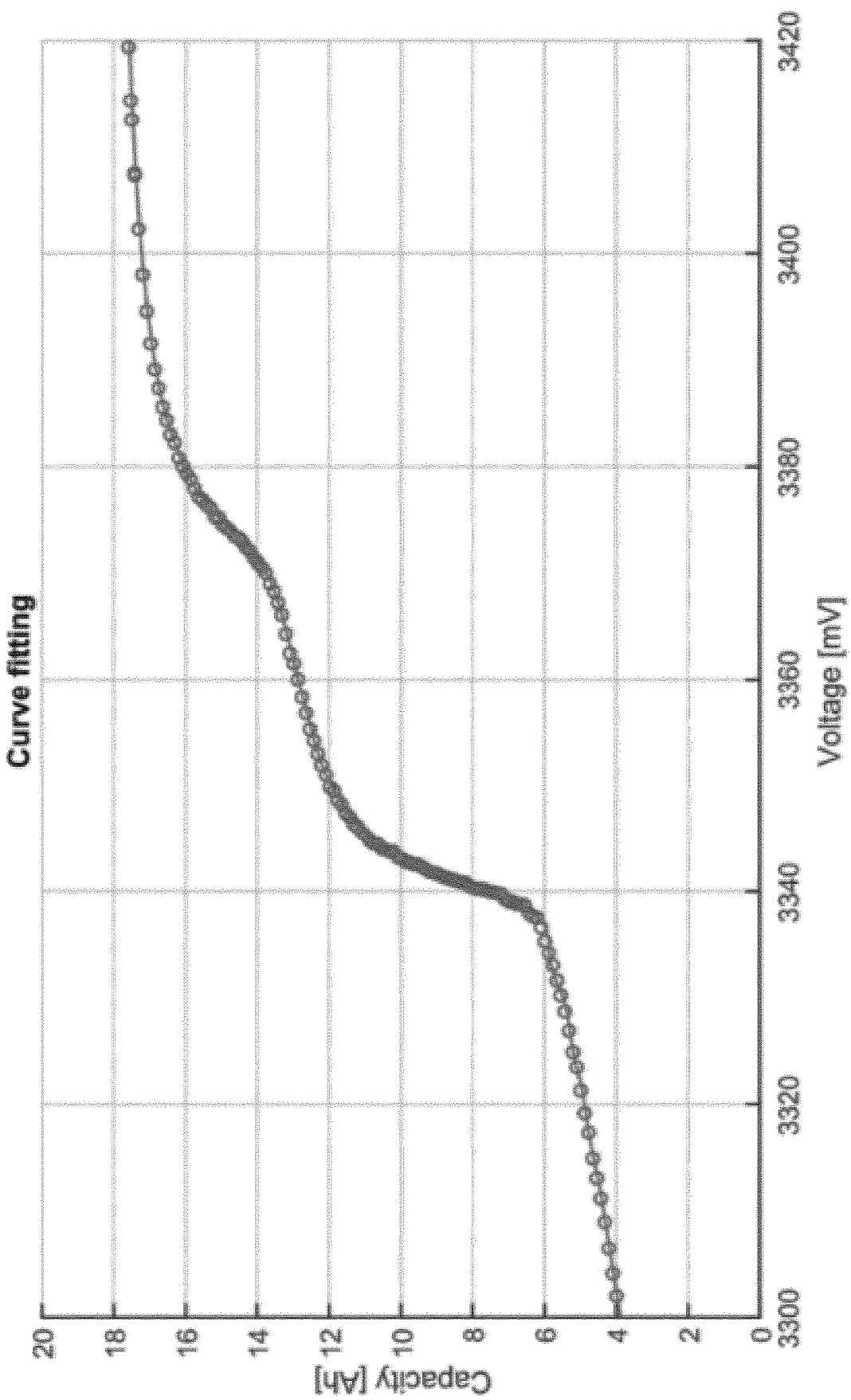

FIGS. 2B and 2C demonstrate the derivation of an incremental capacity curve of FIG. 2A. FIG. 2B illustrates the voltage and capacity data which are monitored during charging of the battery. Each of the charts within FIG. 2B are shown over the same charging period. Battery terminal voltage can be monitored either via electronics integrated within the battery charger or through separate voltage meters provided on the battery pack or within the vehicle or machine employing the battery. As shown in the top figure of FIG. 2B, the charge capacity of the battery can be determined a variety of ways including integration of the amperage supplied to the battery or derivation via other monitored values such as a change in battery terminal voltage.

Within FIG. 2B, the voltage and capacity values are highlighted during a constant current charging period. At least some embodiments of the present invention make a determination of the battery's state of health based on data gather during such a constant current charging. In the illustrated instance, the constant current supplied during the highlighted period is C/3 or one third the battery's C-rate, also known as nominal charging rate. The voltage and capacity values during this period are then plotted within FIG. 2C such that the battery's capacity is on the y-axis versus the battery's voltage on the x-axis. At least some embodiments employ a curve fitting to the values, such as support vector regression in order to arrive at a smoother curve for derivation. The curve of FIG. 2B is then derived in order to arrive at the values of FIG. 2A showing a dQ/dV plot.

While methods employing ICA during charging are primarily discussed herein, ICA can also be used to determine battery parameters, including SOH, during discharging. Within at least some embodiments of the present invention it has been determined that ICA performed during a constant current charging or discharging provides for a more accurate parameter determination. Similarly, embodiments which analyse a lower charging rate have proven to give more accurate results. At least some embodiments limit their data collection for ICA SOH determination to constant current charging or discharging that is at a rate of C/2 or lower, preferably C/3 or lower.

In certain embodiments of the present invention charging is controlled such that at least one of the monitored parameters is held within a predetermined range during a predetermined time period. As detailed above, this could be, for example, a constant rate of charging over a given time period. Alternatively, some embodiments maintain a certain parameter constant over a predetermined range of another parameter during data gathering. For example the current may be held constant between two battery voltage levels and data is gathered only which the current is held constant. For further example, a parameter may be held constant across multiple charging instances to provide for more accurate determinations of battery SOH.

ICA has proven effective across a wide array of battery chemistries and constructions. Lithium-titanate, lithium-iron-phosphate and lithium-manganese-cobalt-oxide batteries have especially shown distinctive changes in their dQ/dV curves which can be used to determine battery parameters including SOH.

Figure 3:
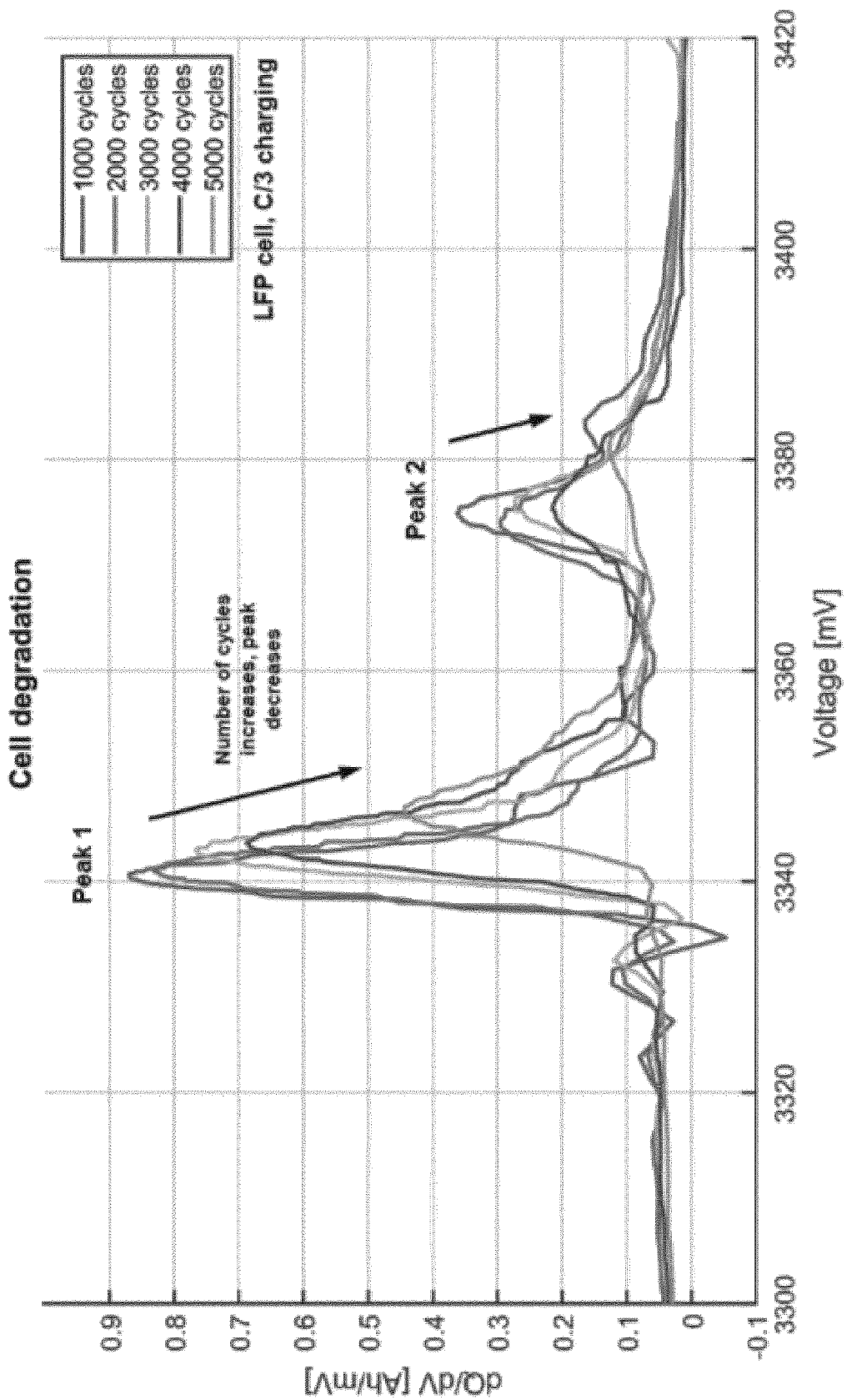
FIG. 3 shows a comparison of incremental capacity curves derived from a battery after a variety of cycles.

As seen in FIG. 3, comparison of a battery's dQ/dV curve over time can be used to make a determination of a battery's age and level of degradation or the battery's SOH. Within FIG. 3 the dQ/dV curve for a battery cell is plotted at for five different charging instances. First at 1000 cycles peaks 1 and 2 show their highest values which degrade consistently after 2000, 3000, 4000 and 5000 cycles with peak 2 becoming rather non-distinct after 5000 cycles. Certain embodiments of the present invention utilize changes in the second peak of a dQ/dV curve in order to determine the capacity or SOH of the battery as, with at least some batteries, changes in the second peak show excellent correlation to a change in battery SOH.

At least some embodiments of the present invention store indications of the number of times the battery has been charged along with parameters of each charging. In such embodiments the first charging instance may provide parameters, such as the highest peaks on a dQ/dV curve for comparison to later charging instances. In at least some embodiments the only information needed from the battery in order to make a determination of state of health is a unique identifier for said battery.

Certain embodiments of the present invention determine the battery's state of health based at least partially on a change in the charge of the battery over a change in voltage of the battery. For example, based on a dQ/dV curve as discussed above. Still other embodiments base the determination of the battery's state of health at least partially on an instantaneous change in the charge over a change in the terminal voltage compared across a range of voltages or a range of historical charging instances. At least some embodiments may determine battery SOH based at least partially on a change in charge over a predetermined voltage range.

Within certain embodiments of the present invention the method of determining the battery's state of health further comprises a step of displaying or sending an indication of the determination. For example, within at least some embodiments data regarding the battery's state of health may be transmitted to a remote location for monitoring of an underground mining operation. Through similar communications at least some embodiments are able to retrieve data regarding historical charging instances from a remote location. For example via wired or wireless communications.

At least some embodiments of the present invention ensure that a determination of battery SOH is completed prior to the completion of charging the battery. In such embodiments data is collected at during a time period selected to be completed prior to the end of a charging cycle.

In certain embodiments of the present invention a total energy supplied to the battery is derived from the values monitored during charging.

At least some of the steps of the methods according to the present invention discussed above may be completed in another order. For example, historical information regarding charging of the battery may be retrieved at any point.

Figure 4:
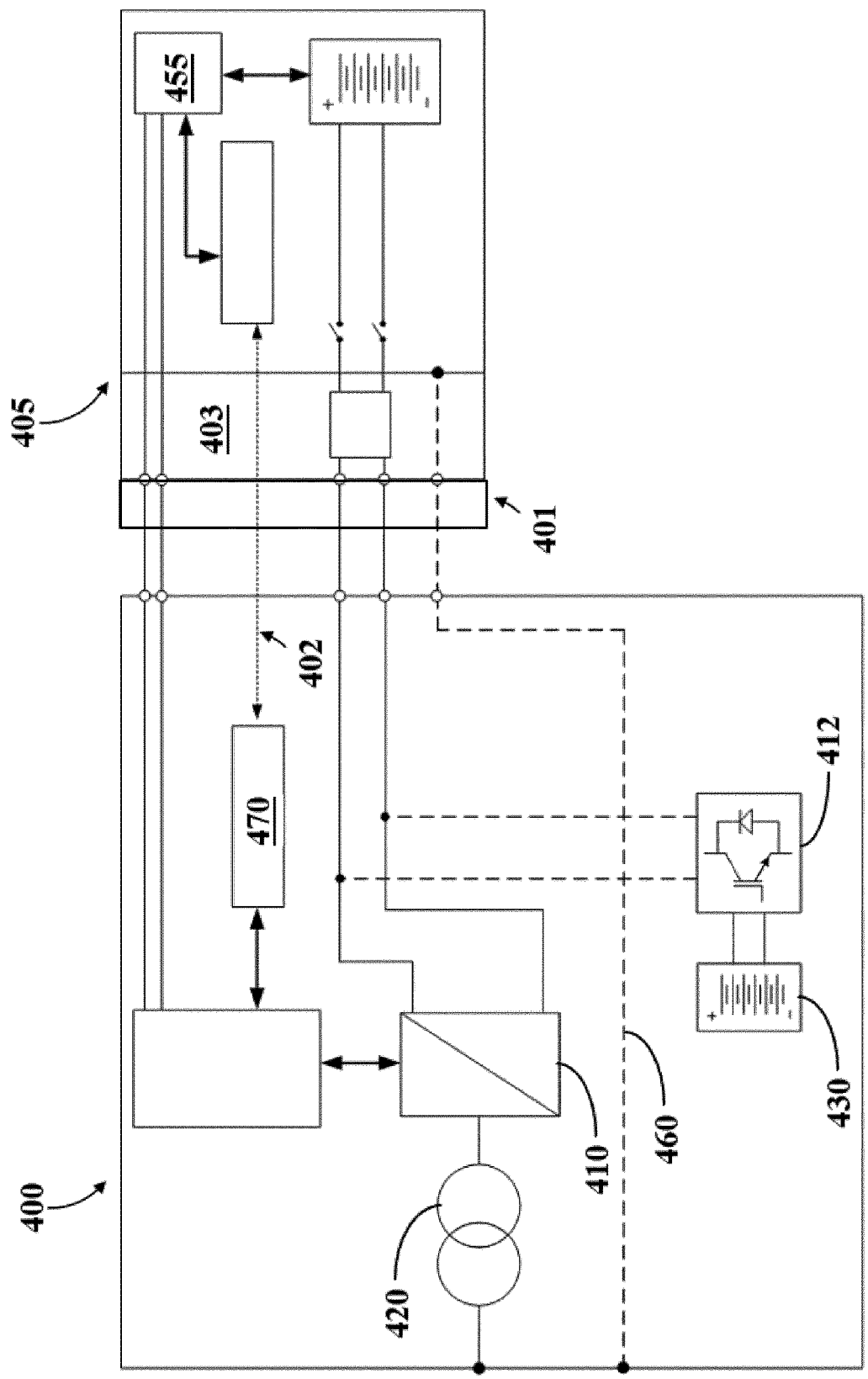
FIG. 4 illustrates an example apparatus capable of supporting at least some embodiments of the present invention.

FIG. 4 illustrates a charging station 400 according to at least some embodiments of the present invention. Also illustrated is an electric vehicle 405 connected to the charging station 400 so that the battery 435 of the electric vehicle 405 may be charged. As shown the charging station 400 comprises power electronics 410 for conversion of input energy into a form suitable for charging a connected battery. FIG. 4 also illustrates an optional transformer 420 for conversion of input electricity, in this case an AC electric input which is converted by the power electronics 410 into a DC output.

As shown in FIG. 4, electrical energy brought from an input, in this case an AC input, is converted by the power electronics 410 which are controlled by a control unit 450 of the charging station 400. By controlling the power electronics 410 the control unit 450 can ensure the proper charging procedures for the connected battery and also implement the methods as discussed herein by collecting information during charging. For example the control unit may employ external meters, integrated meters, or monitor control inputs in order to determine conditions of the attached battery 435 during charging. Certain control units 450 include memory for storage of data, while in some embodiments data is collected via a separate unit such as a datalogger.

Within FIG. 4 a separate communication unit 470 is shown within the charging station 400. This communication unit 470 may also be an integral part of the control unit 450. The communication unit 470 of the charging station 400 is used in connection with a communication unit 475 of the electric vehicle in order to establish a communications link 402. This communications link 402 may be wired or wireless. As with the communication unit 470 of the charging station 400 the communication unit 475 of the electric vehicle may be integrated with the electric vehicle's control unit 455.

At least some charging stations receive a DC input and thus employ power electronics to achieve DC to DC conversion in order to charge the battery. In such embodiments no AC/DC conversion is required and also no transformer at the input.

Integrated within the power electronics 410 or control circuitry 450 are meters configured to monitor conditions of the battery during charging. At least some embodiments of the present invention provide for separate meters which are in communication with the control circuitry 450. Charging devices may have automatic connection or plug-in connection.

At least some charging stations 400 according to the present invention further comprise a supporting battery 430 and DC to DC converter 412 connected between the supporting battery 430 and outputs of the charging station 400. Such supporting batteries 430 may be employed to smooth the load which the charging station 400 puts on the electrical system, for example, to ensure that the charging station does not overload the electrical system of a mine. The DC to DC converter 412 can be used to adjust the output of the charging station such that it charges the supporting battery 430 or such that the supporting battery 430 provides energy to the output of the charging station 400.

As also illustrated within FIG. 4, charging stations according to the present invention may be equipped with a connector or plug-in connection 401. Within FIG. 4 this is illustrated via the leads which leave the charging station 400 being brought to an inlet 403 of the electric vehicle 405 wherein they are interfaced with the electric vehicle 405.

Such a connector 401 allows for reliable and safe connection of the charging station 400 and electric vehicle 405. At least some embodiments employ a plug-socket combination as a connector, wherein the socket would correspond to the inlet previously mentioned. Certain embodiments employ alternative connections such as a pantograph or other onboard current collector device suited for connecting to external conductors. Such a pantograph may be installed either on the electric vehicle 405 or charging station 400. When employed on a charging station 400 the pantographs may be configured to connect to onboard conductors, such as busbars, which are installed on the electric vehicle.

Charging connectors according to certain embodiments also include cables to allow the connectors to be brought to an electric vehicle parked near the charging station. Some charging connectors and cables include pilot contacts and wires. The connector 401 of FIG. 4 includes connections between the control unit 450 of the charging stations and the electric vehicle's control unit 455 to allow for coordination between the control units. Within at least some embodiments this coordination is realized via a wireless connector. Certain embodiments employ only the previously mentioned communications units.

Connectors according to the present invention may also provide for a protective earth or grounding connection 460 as illustrated within FIG. 4. Such a connection ensures that both the charging station and electric vehicle are protected or grounded during charging operations. Contacts as illustrated within FIG. 4 may be realized with one or more contacts per pole, for example there may be at least two contacts per positive and negative DC connection.

As further illustrated within FIG. 4, at least some inlets 403 include a Correct Contact and Lock (CCL) device 415, for example an interlock loop. Such a device helps to further ensure that connectors are employed properly and safely.

Battery chargers according to the present invention are configured to carry out methods of determining a battery's SOH as discussed above. For example the battery charger 410 of FIG. 4 can be configured to: recognize the battery via a unique identifier; charge the battery; monitor at least one of: a voltage supplied to the battery, a current supplied to the battery and a temperature of the battery while charging the battery; store data based at least partially on the values monitored during charging; retrieve data related to at least one earlier charging instance of the uniquely identified battery; and make a determination of the uniquely identified battery's state of health based at least partially on a comparison of data related to the current charging instance and the retrieved data.

At least some charging devices according to the present invention may be operated by a mobile vehicle or other operator. For example the charging device may be configured to begin charging according to a method described herein upon receiving instructions from an operator to begin charging. Such instructions may be transmitted from the normal operating position of the operator within or upon the mobile vehicle, for example via an input on a control panel of the mobile vehicle.

At least some embodiments of the present invention provide for a charging device which may be automatic or at least semi-automatic. Within semi-automatic chargers the charging process begins automatically after a connection of a battery to be charged to the charger. Such a semi-automatic operation may prove beneficial when an operator is required to exit a mobile vehicle in order to plug it into a charger and thus does not need to return to the operating position of the vehicle to start charging according to a method discussed herein. Certain charging devices according to the present invention are automatic in that no human interaction is required in order for charging to take place. For example a method of charging as discussed herein may begin automatically.

Certain battery chargers according to the present invention are configured to charge vehicle or machinery with the battery installed. That is the battery is not removed from a normal operating position during charging.

At least some embodiments of the present invention provide for a stationary underground charging station. Such charging stations may be used to charge vehicles used in underground operations, such as mining. These stationary underground stations are configured to determine the battery state of the health at the same time that the battery is charged. Within at least some embodiments battery information such as voltage, current and temperature are transmitted to the charging station through wifi connection during charging. Such information can then be used to determine battery SOH via one of the methods discussed above.

Within some embodiments of the present invention data regarding battery SOH is transmitted to a central management system, such as a system for oversight and control of mining equipment within a mine.

At least some embodiments of the present invention provide for a work machine, comprising means configured to perform the methods discussed above. Within certain embodiments the work machine is a load and/or haul vehicle or a drilling rig for underground worksites.

Certain embodiments of the present invention find use in charging of unground mobile vehicles. Underground mobile vehicle may be unmanned, for example remotely controlled from a control room, or manned, that is operated by an operator sitting in a cabin of the mobile vehicle. Mobile vehicles operating in underground work sites may be autonomously operating, i.e. automated mobile vehicles, which in their normal operating mode operate independently without external control but which may be taken under external control at certain operation areas or conditions, such as during states of emergencies. Underground mobile vehicles may be used as earth moving machinery, for example a dump truck or a Load Haul Dump (LHD) vehicle.

The term underground worksite herein is intended to include a variety of underground worksites, including for example different kinds of underground excavation worksites, such as mines, roadwork sites, and railroad worksites. The term mobile vehicle herein refers generally to mobile work machines suitable to be used in the operation of different kinds of underground mining or construction excavation worksites, such as lorries, dumpers, dump trucks, vans, mobile rock drilling or milling rigs, mobile reinforcement machines, and bucket loaders or other kind of mobile work machines which may be used in different kinds of excavation worksites. Further examples of mobile vehicles as discussed herein include utility vehicles, such as people carriers and electric cars. The mobile vehicles may be autonomously operating mobile vehicles, which herein refers to automated or semi-automated mobile vehicles.

Certain embodiments of the present invention provide for a battery charger comprising at least one processing core, at least one memory including computer program code, the at least one memory and the computer program code being configured to, with the at least one processing core, cause the battery charger at least to perform a method to determine battery state of health as discussed above. For example the battery charger may be caused to at least: recognize the battery via a unique identifier; charge the battery; monitor at least one of: a voltage supplied to the battery, a current supplied to the battery and a temperature of the battery while charging the battery; store data based at least partially on the values monitored during charging; retrieve data related to at least one earlier charging instance of the uniquely identified battery; and determine a state of health of the uniquely identified battery based at least partially on a comparison of data related to the current charging instance and the retrieved data. Mobile vehicles may also be referred to as electric vehicles herein. Reference as electric vehicle includes but is not limited to vehicles employing electric motors as their primary drives and hybrid vehicles.

Some embodiments of the present invention are communicatively connected to a further system and/or network, such as a worksite management system, a cloud service, an intermediate communications network, such as the internet, etc. Such a system may, for example, serve as a remote storage and/or computing system. Such a service or system may be used to store data regarding charging instances. For example charging data may be sent by a charger to the cloud service and then retrieved later in order to make a determination as per the methods discussed herein. The cloud service may also be used to perform calculations as per the methods discussed herein. At least some embodiments employ a cloud service to both store the data and make the determinations as per the methods herein. For example a charger may be configured to charge a battery and monitor said charging while sending data gathered during charging to the cloud service. The data sent to the cloud service may then be used to make a determination as discussed within the methods herein. Such a determination may then be displayed, for example within the worksite management system or sent back to the charger for display locally at the charger or within a vehicle being charged by the charger.

At least some embodiments of the present invention provide for a non-transitory computer readable medium having stored thereon a set of computer readable instructions that, when executed by at least one processor, cause a battery charger to at least: recognize a battery connected to the charger via a unique identifier; charge the battery; monitor at least one of: a voltage supplied to the battery, a current supplied to the battery and a temperature of the battery while charging the battery; store data based at least partially on the values monitored during charging; retrieve data related to at least one earlier charging instance of the uniquely identified battery; and determine a state of health of the uniquely identified battery based at least partially on a comparison of data related to the current charging instance and the retrieved data.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", i.e. a singular form, throughout this document does not exclude a plurality.

ACRONYMS LIST

AC Alternating Current
C C-rate
DC Direct Current
EOL End of Life
ICA Incremental Capacity Analysis
LHD Load Haul Dump
LFP Lithium Iron Phosphate
RFID Radio Frequency Identification
SOC State of Charge
SOH State of Health

The invention claimed is:

1. A method for determining the state of health of a battery by monitoring charging of said battery over multiple charging instances, comprising a charging station implementing steps of:
   recognizing the battery via a unique identifier;
   charging the battery;
   monitoring conditions of the battery during charging, said conditions including at least one of a voltage supplied to the battery, a current supplied to the battery and a temperature of the battery;
   storing data related to the current charging instance based at least partially on the monitored conditions;
   retrieving data related to at least one earlier charging instance of the uniquely identified battery; and
   making, during charging of the battery, a determination of the uniquely identified battery's state of health based at least partially on a comparison of the data related to the current charging instance and the retrieved data related to at least one earlier charging instance.

2. The method according to claim 1, wherein the only data used in the determination of the battery's state of health is data gathered during charging of the battery.

3. The method according to claim 1, wherein the determination of the battery's state of health is based on data gathered during constant current charging of the battery.

4. The method according to claim 1, wherein the determination of the battery's state of health is based at least partially on a change in monitored values between at least two monitored charging sessions.

5. The method according to claim 1, wherein only data gathered during a constant-current phase of charging is used to make a determination of the battery's state of health.

6. The method according to claim 1, wherein, the only information required from the battery in making the determination of state of health is the unique information identifier.

7. The method according to claim 1, further comprising controlling the charging such that at least one of the monitored parameters is held within a predetermined range during a predetermined time period.

8. The method according to claim 1, wherein the determination of the battery's state of health is based at least partially on a change in charge over a predetermined voltage range.

9. The method according to claim 1, wherein the determination of the battery's state of health is based at least partially on a change in a charge of the battery over a change in voltage of the battery.

10. The method according to claim 9, wherein the determination of the battery's state of health is based at least partially on an instantaneous change in a charge of the battery over a change in voltage compared across a range of voltages.

11. The method according to claim 1, wherein data regarding a previous charging instance is retrieved from a remote location via wired or wireless communication.

12. A battery charging station for determining the state of health of a battery by monitoring charging of a battery over multiple charging instances, the charging station comprising power electronics configured to control delivery of electric energy to the battery and control circuitry connected to the power electronics to cause:
   recognizing the battery via a unique identifier;
   charging the battery;
   monitoring conditions of the battery during charging, said conditions including at least one of a voltage supplied to the battery, a current supplied to the battery and a temperature of the battery;
   storing data related to the current charging instance based at least partially on the monitored conditions;
   retrieving data related to at least one earlier charging instance of the uniquely identified battery; and
   making, during charging of the battery, a determination of the uniquely identified battery's state of health based at least partially on a comparison of the data related to the current charging instance and the retrieved data related to at least one earlier charging instance.

13. The charging station of claim 12, further comprising a communication unit configured to communicate with an electric vehicle containing the battery.

14. A battery charger comprising at least one processing core, at least one memory including computer program code, the at least one memory and the computer program code being configured to, with the at least one processing core, cause the battery charger at least to:
   recognize the battery via a unique identifier;
   charge the battery;
   monitor conditions of the battery during charging, said conditions including at least one of: a voltage supplied to the battery, a current supplied to the battery and a temperature of the battery while charging the battery;
   store data related to the current charging instance based at least partially on the monitored conditions;
   retrieve data related to at least one earlier charging instance of the uniquely identified battery; and
   determine a state of health of the uniquely identified battery based at least partially on a comparison of data related to the current charging instance and the retrieved data related to at least one earlier charging instance.

15. A work machine, comprising means configured to perform the method of claim 1.

16. The work machine of claim 15, wherein the work machine is a load and/or haul vehicle or a drilling rig for underground worksites.

\* \* \* \* \*